United States Patent [19]
Noonan, II

[11] Patent Number: 6,034,919
[45] Date of Patent: Mar. 7, 2000

[54] METHOD AND APPARATUS FOR USING EXTENDED-DATA OUTPUT MEMORY DEVICES IN A SYSTEM DESIGNED FOR FAST PAGE MODE MEMORY DEVICES

[75] Inventor: Robert W. Noonan, II, Harris County, Tex.

[73] Assignee: Compaq Computer Corporation, Houston, Tex.

[21] Appl. No.: 08/775,315

[22] Filed: Dec. 31, 1996

[51] Int. Cl.[7] ................................................ G11C 8/00
[52] U.S. Cl. ............................... 365/233.5; 365/189.05; 365/230.01; 365/203; 365/235; 365/222
[58] Field of Search ............................... 365/189.05, 203, 365/230.01, 222, 233.5, 235, 193, 189.03; 711/167, 169; 395/849, 855

[56] References Cited

U.S. PATENT DOCUMENTS

| | | | |
|---|---|---|---|
| 5,349,566 | 9/1994 | Merritt et al. | 365/233.5 |
| 5,457,659 | 10/1995 | Schaefer | 365/222 |
| 5,490,114 | 2/1996 | Butler et al. | 365/189.05 |
| 5,526,320 | 6/1996 | Zagar et al. | 365/233.5 |
| 5,546,344 | 8/1996 | Fawcett | 365/189.05 |
| 5,555,209 | 9/1996 | Smith et al. | 365/189.05 |
| 5,563,840 | 10/1996 | Hayakawa et al. | 365/230.01 |
| 5,644,549 | 7/1997 | Ju | 365/235 |
| 5,654,935 | 8/1997 | Hisada et al. | 365/233.5 |
| 5,682,354 | 10/1997 | Manning | 365/233.5 |
| 5,721,859 | 2/1998 | Manning | 365/189.05 |
| 5,737,276 | 4/1998 | Shin et al. | 365/203 |

*Primary Examiner*—B. James Peikari
*Attorney, Agent, or Firm*—Akin, Gump, Strauss, Hauer & Feld, L.L.P.

[57] ABSTRACT

A memory system including a memory controller that operates in conformity with fast page mode (FPM) memory devices and an extended-data output (EDO) memory device configured to operate with the FPM memory controller by having an output enable input receiving a column address strobe (CAS) signal from the memory controller. The EDO memory device terminates its data cycle upon negation of the CAS signal, so that it operates in a similar manner as an FPM memory device. This prevents data corruption and bus cycle contention. The memory system includes a memory board coupled through a memory board connector, which receives the CAS signal from the memory controller. The memory board includes one or more module connectors, each having an output enable contact receiving the CAS signal. The EDO memory device is mounted on a memory module and includes an output enable input pin which receives the CAS signal when the memory module is plugged into the memory board. In this manner, a computer including a memory system implemented to operate with FPM memory may be upgraded to EDO memory.

20 Claims, 2 Drawing Sheets

METHOD AND APPARATUS FOR USING EXTENDED-DATA OUTPUT MEMORY DEVICES IN A SYSTEM DESIGNED FOR FAST PAGE MODE MEMORY DEVICES

FIELD OF THE INVENTION

The present invention relates generally to the field of memory systems of a computer, and more particularly to a method and apparatus for using EDO memory devices in a memory system designed for FPM memory devices.

DESCRIPTION OF THE RELATED ART

One of the more common types of memory technology used to implement the system memory of a computer system or personal computer is dynamic random access memory (DRAM). A 60 nanosecond (ns) DRAM provides data to a memory controller within 60 ns after assertion of address. There are certain time constraints, however, for the memory controller to set-up addresses, receive the data and prepare for the next cycle. An entire memory cycle, from the time the memory controller provides an address to the time the memory controller is ready to provide the next address, ranges between 85–125 ns. Fast page mode (FPM) DRAM technology improved memory performance with respect to prior methods by decreasing memory access cycle time. In particular, FPM memory chips allowed the memory controller to access other data bits in the same "page", or on the same row within the memory matrix of the memory chip. Each data bit is accessed by a row and column address, where the row address for FPM is provided set up early to "precharge" a page of the memory chip. Then, a series of column addresses are asserted to access data on the same row. This saves time since the row address does not have to be set up for each column address within that page.

Extended Data-Out (EDO) memory technology decreases cycle times even further by allowing the memory controller to begin a new column address instruction while it is reading data at the current address. Unlike FPM, the data output drivers for EDO are not turned off when the memory controller removes a column address strobe (CAS) signal to begin the next cycle. Thus, the memory controller may negate the CAS signal earlier to prepare for the next cycle, so that each cycle is shorter. This saves approximately 10 ns per cycle. Memory modules are currently available up to a maximum size of 256 megabytes (MB), which are typically implemented using dual inline memory module (DIMM) configurations for high-end systems, such as workstation PCs and servers. For space and power considerations, a PC includes up to 16 slots, so that the memory may be extended to a total of 4 GB.

Since FPM is fast becoming obsolete and since EDO is a relatively new technology, it would be advantageous to replace the FPM memory modules with EDO memory modules. A computer system must be designed, however, to make use of the additional efficiency of EDO. Many computer systems, including some high-end systems, were designed before the introduction of EDO and thus only support FPM type memory. For example, the Orion chipset by the Intel Corporation (Intel) is designed for FPM only and does not support EDO. Furthermore, using EDO memory in systems designed for FPM will typically result in data corruption and bus cycle contention on the memory bus.

Since computer systems often represent a significant investment, it is desired to make use of EDO memory even if memory performance is not changed. For example, it is desirable to enable a user to upgrade to EDO rather than having to maintain an inventory of obsolete memory devices. Direct replacement of the DIMM boards in a system designed specifically for FPM, however has heretofore not been an option.

SUMMARY OF THE INVENTION

A memory system according to the present invention includes a memory controller that operates in conformity with FPM memory devices to store and retrieve data by providing row and column addresses and corresponding strobe signals including a column address strobe (CAS) signal, and an EDO memory device having an output enable input receiving the CAS signal. The memory system includes a memory board coupled through a memory board connector, which receives the CAS signal from the memory controller. The memory board includes one or more module connectors, each having an output enable contact receiving the CAS signal. The output enable is not grounded on the memory board, so that it is driven by the CAS signal from the memory controller. The EDO memory device is mounted on a memory module and includes an output enable input pin that receives the CAS signal when the memory module is plugged into the memory board. In this manner, the EDO memory device terminates its data output in conjunction with the CAS signal in a similar manner as a comparable FPM memory device. This prevents data corruption and cycle contention during each memory cycle.

Each memory module connector includes a plurality of conductive contacts including an output enable contact that receives the CAS signal. The memory module includes a module connector that plugs into the memory module connector, where the module connector also includes a plurality of conductive contacts including an output enable contact that electrically couples to the output enable contact of the memory module connector. The memory module further includes a conductor electrically coupled to the output enable contact of the memory module to receive the CAS signal. The EDO memory device is preferably a memory chip having an output enable input pin electrically coupled to the output enable conductor on the memory module.

In the preferred embodiment, each memory module includes a plurality of EDO memory chips, each having an output enable input pin electrically coupled to the output enable conductor on the memory module carrying the CAS signal. The EDO memory module has a storage capacity of approximately 256 megabytes (MB). The memory system preferably includes a plurality of memory modules, each configured in a similar manner. The illustrated embodiment includes up to 16 EDO dual inline memory modules (DIMMs) having a storage capacity of approximately four (4) gigabytes.

A computer system according to the present invention includes a host bus, a processor that executes memory cycles on the host bus, a memory controller that detects the host bus memory cycles and that operates in conformity with FPM memory devices to store and retrieve data, and a memory system coupled to the memory controller and including EDO memory devices having output enable inputs receiving the CAS signal. The memory system may include a memory bus for coupling to a memory board, which includes memory module connectors for receiving compatible memory modules. The memory modules include module connectors that plug into any one of the memory module connectors to conduct the CAS signal to the EDO memory devices.

A method of operating a memory system designed for FPM memory to operate with EDO memory according to the present invention comprises steps of replacing FPM memory devices with EDO memory devices, asserting column and row address signals and corresponding strobe signals including a CAS signal according to FPM operation to the EDO memory devices, and providing the CAS signal to the output enable input of each of the EDO memory devices.

A method and apparatus according to the present invention allows a user to upgrade a computer system designed for FPM memory with EDO memory. The user of a FPM system obtains the benefit of replacing FPM memory modules with EDO memory modules, and thus is able to upgrade to a newer technology without having to maintain an obsolete inventory of FPM devices.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
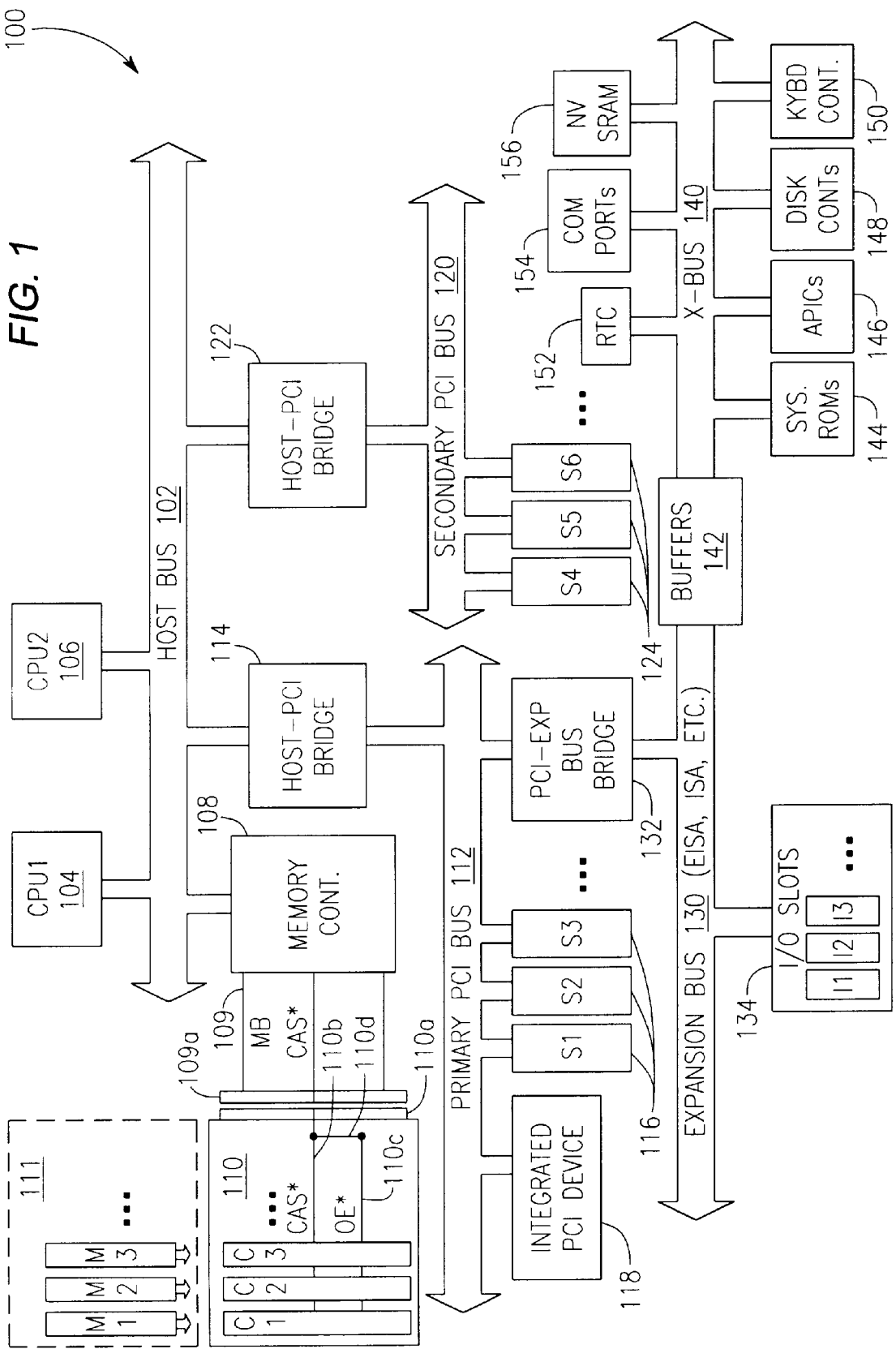
FIG. 1 is a system block diagram of a computer system incorporating a memory system implemented according to the present invention.

Referring now to FIG. 1, a system block diagram is shown of a computer system 100 incorporating a memory system implemented according to the present invention. The computer system 100 is preferably an IBM-compatible, high-end personal computer (PC) system or the like typically used for workstations or server systems. The computer system 100 includes a host bus 102 coupled to one or two central processing units (CPUs) CPU1 104 and CPU2 106. The CPUs 104, 106 preferably include 32-bit Pentium™ or P6 CPUs by Intel and supporting circuitry. The host bus 102 preferably includes 32 address lines and 64 data lines as compatible with the CPUs 104, 106. Although the present invention is illustrated with a multiprocessor, IBM-compatible type PC system, it is understood that the present invention is applicable to other types of computer systems and processors as known to those skilled in the art.

A memory controller 108 is coupled to the host bus 102 for interfacing a system memory 111 via a memory bus (MB) 109. The memory bus 109 includes a plurality of address, data and control signals for interfacing the system memory 111. The system memory 111 is preferably implemented with one or more compatible memory modules M1, M2, M3, etc., collectively referred to as Mn, plugged into corresponding memory slot connectors C1, C2, C3, etc., collectively referred to as Cn, mounted on a removeably coupled memory board 110. A memory board connector 109a is mounted on the motherboard and includes contacts for electrically coupling to each of the signals of the memory bus 109. The memory board 110 includes a compatible connector 110a for plugging into the memory board connector 109a, where the connector 110a includes corresponding contacts for each of the contacts of the memory board connector 109a, and thus for each of the signals of the memory bus 109. The memory board 110 further includes a plurality of conductors (not shown) as known to those skilled in the art for routing each of the contacts of the connector 110a to corresponding contacts of each of the memory slot connectors Cn.

The control signals asserted by the memory controller 108 includes a column address strobe (CAS*) signal for synchronizing the memory cycles of the system memory 111. An asterisk (*) appended to a signal name denotes negative or inverted logic, where the signal is considered asserted when low. The CAS* signal is carried via a corresponding signal line on the memory bus 109, via corresponding contacts of the connectors 109a, 110a, and via a corresponding conductor 110b on the memory board 110 to each of the memory slot connectors Cn. Another conductor 110c on the memory board 110 carries an output enable signal OE* to each of the memory slot connectors Cn. The memory bus 109 and the connectors 109a, 110a may or may not include lines or contacts for the OE* signal. Either embodiment is contemplated. Typically, the conductor 110c is coupled to ground through a pull-down resistor (not shown) or the like for pulling the OE* signal low. For purposes of the present invention, however, the OE* signal is not pulled low, but is instead coupled to the CAS* signal. For example, a conductor 110d is added to electrically couple the conductors 110b and 110c together, so that the OE* signal follows the CAS* signal. The purpose for this will be described more fully below.

Each of the memory modules Mn include a plurality of contacts for electrically coupling to corresponding contacts on any one of the memory slot connectors Cn. Each of the memory modules Mn preferably includes several Extended Data-Out (EDO) dynamic random access memory (DRAM) chips for a total of 256 megabyte (MB) of memory per board. For a motherboard including up to sixteen (16) memory slot connectors Cn, the system memory 111 is expandable to a total of 4 GB of memory. Each of the CPUs 104, 106 are capable of addressing memory and devices mapped between 00000000h and FFFFFFFFh (4 GB of memory space) using a 32-bit address bus.

The memory controller 108 detects memory cycles on the host bus 102 executed by either of the CPUs 104, 106 for reading data from or writing data to the system memory 111. The memory controller 108 executes corresponding memory cycles on the memory bus 109 to retrieve or store data In particular, the memory controller 108 converts such host bus memory cycles by retrieving a memory address on the host bus 102 and converting the host address into appropriate row and column addresses suitable for the system memory 111. The memory controller 108 also asserts a row address strobe (RAS*) signal and the CAS* signal on the memory bus 109 for synchronizing the memory cycles on the memory bus 109. The RAS* and CAS* signals or their equivalents are typically inverted for practical memory devices. The memory controller 108 is preferably designed for operation with fast page mode (FPM) memory modules, which is typically incompatible with EDO memory operation. As described below, the present invention ensures proper operation between the memory controller 108 and the system memory 111 regardless of whether implemented with FPM or EDO memory.

The computer system 100 preferably includes a primary PCI bus 112 coupled to the host bus 102 via a Host-PCI bridge 114. The primary PCI bus 112 is typically implemented with one or more PCI slots 116, individually labeled S1, S2, S3, and so on. Each of the PCI slots 116 are configured to receive compatible PCI adapter cards incorporating one or more PCI devices as known to those skilled in the art. Typical PCI devices include network interface cards (NICs) disk controllers such as a SCSI (small computer systems interface) disk controller, video or graphics controllers, etc. One or more integrated PCI devices 118 may be integrated onto the motherboard itself and coupled directly to the primary PCI bus 112.

A secondary PCI bus 120 is provided and coupled to the host bus 102 through another Host-PCI bridge 122. The secondary PCI bus 120 is provided for further PCI expansion capability and includes one or more slots 124, which are consecutively numbered above the PCI slots S1–S3, such as PCI slots S4, S5, S6, etc. Although only six (b 6) PCI slots are shown, more PCI slots may be added to either PCI bus 112, 120 as needed or desired. Additional host PCI buses may be provided on the motherboard and coupled to the host bus 102 as desired.

The computer system 100 preferably includes an expansion bus 130 coupled to the primary PCI bus 112 through a PCI-Expansion bus bridge 132. The expansion bus 130 is any one of many different types, including the industry standard architecture (ISA) bus, also referred to as the AT bus, the extended industry standard architecture (EISA) bus, or the microchannel architecture (MCA) bus, among others. For high-end PC systems, the EISA bus is preferred because it provides greater performance, where the PCI-expansion bus bridge 132 is a PCI-EISA bridge. The expansion bus 130 preferably includes one or more expansion or input/output (I/O) slots 134, individually labeled I1, I2, I3, etc. Various devices incorporated on I/O adapter cards may be coupled to the expansion bus 130 through the I/O slots 134, including expansion bus memory, modems, disk controllers, sound cards, NICs and various other types of controllers as known to those skilled in the art The expansion bus 130 also couples to a peripheral expansion bus referred to as the X-bus 140 through a set of bus buffers 142. The X-bus 140 is used for connecting various system components and peripherals to the computer system 100, such as a system ROM 144 comprising one or more ROM modules, one or more APICs (advanced programmable interrupt controllers) 146, one or more disk controllers 148 (such as a floppy disk controller (FDC) and a hard disk controller (HDC)), a keyboard controller 150, a real time clock (RTC) and timers 152, communication ports 154, non-volatile static random access memory (NVSRAM) 156, as well as other peripherals not shown, such as a direct memory access (DMA) system, diagnostics ports, command/status registers, battery-backed CMOS memory, etc.

Figure 2A:
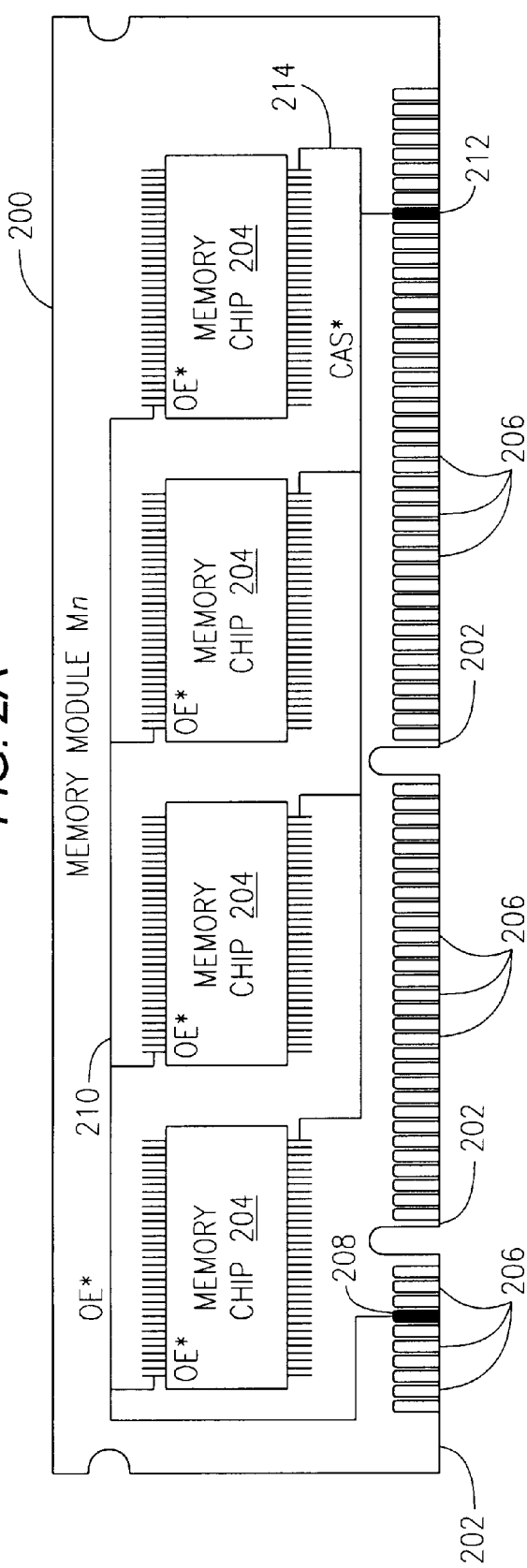
FIG. 2A is a side view of a memory module illustrating each of the memory modules for plugging into any of the memory slots of the computer system shown in FIG. 1.

Referring now to FIG. 2A, a side view is shown of a memory module 200, which illustrates any one of the memory modules Mn that plug into any one of the memory slot connectors Cn to comprise the system memory 111. In the preferred embodiment, the memory module 200 is implemented as a dual inline memory module (DIMM) configuration, which includes one or more edge connectors 202. Each connector 202 includes a plurality of conductive contacts 206 mounted on both sides of each edge connector 202 (opposite side not shown). One exemplary embodiment includes three (3) edge connectors 202, a first including 10 contacts 206 on either side, a second including 30 contacts 206 on either side and a third including 44 contacts 206 on either side, for a total of 168 contacts 206. One or more memory chips 204 are mounted on the memory module 200, where each memory chip 204 is preferably an EDO DRAM module, such as the KM44V16004A or KM44V16104A 16 M×4 bit CMOS DRAM with EDO by Samsung Electronics, or any other similar EDO type memory chip. Preferably, the memory module 200 includes a total of 256 megabyte (MB) of memory, 16 such boards plugged into sixteen of the memory slot connectors Cn provides a system memory 111 of 4 GB.

Each of the memory chips 204 includes an inverted output enable pin OE*, which enables or disables the output signals of each memory chip 204 during operation depending upon whether the OE* pin is asserted low or negated high, respectively. One of the contacts 206 is an output enable contact 208, which carries the OE* signal from the memory board 110. A conductor 210 is electrically coupled to the output enable contact 208 and routed to each output enable pin OE* of each of the memory chips 204. Each of the memory chips 204 also includes an inverted CAS* pin. Another one of the contacts 206 is a CAS contact 212, which carries the CAS* signal from the memory board 110. A conductor 214 is electrically coupled to the CAS contact 212 and routed to each CAS* input pin of each of the memory chips 204. The particular location and configuration of contacts, pins and routed conductors shown in FIG. 2A is for purposes of illustrating the electrical connections only and not intended to physically duplicate an actual memory module.

Figure 2B:
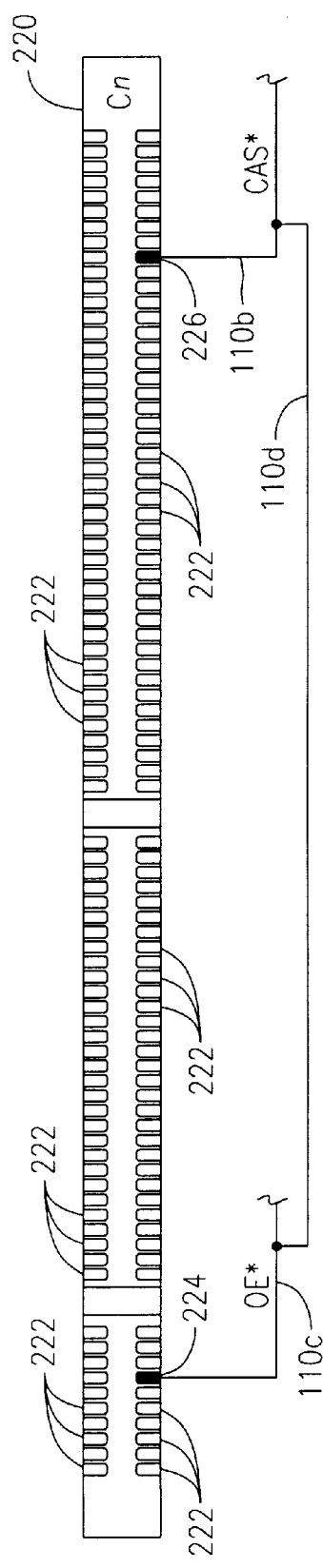
FIG. 2B is a top view of a connector for implementing each of the memory slots of the computer system shown in FIG. 1 for receiving and connecting to the memory module of FIG. 2A.

FIG. 2B is a top view of a connector 220 for implementing each of the memory slot connectors Cn mounted on the memory board 110 for receiving and connecting to a memory module, such as the memory module 200. Preferably, the connector 220 shown is implemented as a DIMM connector including 84 contacts 222 aligned on two sides a total of 168 contacts 222. Although the present invention is illustrated with 168 DIMM type modules and compatible connectors, the present invention may be utilized with any type of suitable module, board and connector configuration. One of the contacts 222 is an output enable contact 224 connected to the conductor 110c, where the conductor 110c carries the OE* signal from the memory board 110. Another one of the contacts 222 is a CAS contact 226 connected to the conductor 110b, where the conductor 110b carries the CAS* signal from the memory controller 108 on the memory bus 109 via the memory board 110. When the memory module 200 is plugged into the connector 220, the edge connectors 202 of the memory module 200 are aligned with corresponding sections of the connector 220, so that each of the contacts 222 are aligned with and connected to a corresponding one of the contacts 206 of the memory module 200. In this manner, the contacts 224, 226 are electrically connected to the respective contacts 208, 212 for conducting the OE* and CAS* signals from the memory board 110. As described previously, a conductor 110d couples the CAS* and OE* signals, so that the output enable input pins of each of the memory chips 204 follows the CAS* signal from the memory controller 108.

As described above, it is general practice in the industry to pull the OE* signal to ground, typically through one or more pull-down resistors or the like. In this manner, the output signals of each memory chip of each of the memory modules are typically always enabled during normal operation. Since the memory controller 108 is implemented for FPM memory, however, normal memory modules configured with EDO DRAM chips in this manner plugged into a normal memory board, which is then plugged into the motherboard, would result in data corruption and bus cycle contention on the memory bus 109, which would be reflected on the host bus 102.

In particular, according to FPM operation, the memory controller 108 expects that the output signals of FPM memory chips are disabled immediately or very soon after the CAS* signal is negated high during each memory cycle. However, EDO memory chips hold the output data signals valid for a longer period of time after the CAS* signal is negated. During some memory cycles, the memory controller 108 reasserts the CAS* signal low relatively quickly after being negated, which is allowed for FPM operation. For EDO operation, however, where the data from the previous cycle is still present on the output data signal lines after negation of the CAS* signal, the memory controller 108 latches the incorrect data resulting in data corruption and cycle contention.

As described above with reference to FIGS. 2A and 2B, the CAS* signal is conducted and connected to the output enable OE* signals of each of the memory chips 204 of each of the memory modules Mn. In this manner, when the memory controller 108 negates the CAS* signal high during each memory cycle, the OE* output enable pins of each of the memory chips 204 is also pulled high. As a result, the DRAM output buffers of each of the EDO memory chips 204 of each memory module 200 disable their outputs and terminate the data, thereby eliminating the possibility of cycle contention or data corruption. Although the present invention is illustrated with negative logic CAS* and OE* signal/pins, it is understood that any logic configuration is contemplated for coupling the column address strobe to the output enable signal of EDO memory modules. Also, the CAS* and OE* signals may be tied together at any point, including locations on the motherboard (assuming the OE* signal is on the motherboard) or on each of the memory modules Mn. However, this would require modification of the motherboard and/or each of the memory modules. It is expedient to disable or remove the pull-down devices coupled to the EO* signal and tie the CAS* and OE* signals together on the memory board which receives the memory modules.

It is appreciated that a method and apparatus for using EDO memory devices in a memory system designed for FPM memory devices enables the use of either FPM or EDO memory modules. By coupling the column address strobe signal to the output enable inputs of the EDO memory devices, the EDO memory devices operate in a similar manner as FPM memory devices. The user of a FPM system obtains the benefits of replacing obsolete FPM memory modules with newer technology EDO memory modules, and riot having to maintain an obsolete inventory of FPM devices.

Although a system and method according to the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

I claim:

1. A memory system for a computer, comprising:

a memory controller that operates according to operation of fast page mode memory devices to store and retrieve data by providing row and column addresses and corresponding strobe signals including a column address strobe signal;

an extended-data output memory device having an output enable input; and a connection device that provides the column address strobe signal to the output enable input of the extended-data output memory device.

2. The memory system of claim 1, wherein said extended-data output memory device comprises at least one extended-data output memory chip having an output enable input receiving said column address strobe signal.

3. The memory system of claim 1, wherein the connection device comprises:

a memory board that couples to said memory controller and receives said column address strobe signal, wherein said memory board provides said column address strobe signal to said output enable input of said extended-data output memory device.

4. The memory system of claim 3, wherein said memory board comprises:

a first conductor receiving said column address strobe signal; and at least one memory module connector having a plurality of conductive contacts including an output enable input contact coupled to said first conductor.

5. The memory system of claim 4, wherein said extended-data output memory device comprises:

at least one memory module having a plurality of conductive contacts including an output enable input contact that couples to said output enable input contact of said at least one memory module connector;

a second conductor coupled to said output enable input contact of said at least one memory module; and at least one extended-data output chip having an output enable input pin coupled to said second conductor.

6. The memory system of claim 5, further comprising:

said at least one extended-data output chip comprising a plurality of extended-data output memory chips, each having an output enable input pin electrically coupled to said second conductor.

7. The memory system of claim 6, wherein said plurality of extended-data output memory chips has a storage capacity of approximately 256 megabytes.

8. The memory system of claim 1, further comprising:

the connection device comprising a memory board, coupled to said memory controller, including a plurality of memory module connectors each receiving said column address strobe signal and providing said column address strobe signal to an output enable conductor;

a plurality of memory modules, each interfaced to a corresponding one of said plurality of memory module connectors, that each have an output enable input coupled to said output enable conductor and that receive said column address strobe signal via said output enable conductor; and said extended-data output memory device comprising a plurality of extended-data output memory chips distributed on said plurality of memory modules, each of said plurality of extended-data output memory chips having an output enable input coupled to said output enable input of a corresponding one of said plurality of memory modules.

9. The memory system of claim 8, wherein said plurality of extended-data output memory chips has a storage capacity of approximately four gigabytes.

10. A computer system, comprising:

a host bus;

a processor coupled to said host bus that executes memory cycles on said host bus;

a memory controller coupled to said host bus that detects said memory cycles and operates in conformity with fast page mode memory devices to store and retrieve data by providing row and column addresses and by providing a row address strobe signal and a column address strobe signal; and a memory system, coupled to said memory controller, including:
- at least one extended-data output memory device having an output enable input; and
- a connection device that provides the column address strobe signal to the output enable input of the at least one extended-data output memory device.

11. The computer system of claim 10, wherein said memory system further comprises:

the connection device comprising a memory board, coupled to said memory controller, that receives said column address strobe signal; and at least one memory module, coupled to said memory board that has at least one extended-data output memory chip mounted thereon having an output enable input pin receiving said column address strobe signal.

12. The computer system of claim 11, further comprising:

said at least one extended-data output memory chip comprising a plurality of extended-data output memory chips, each having an output enable input pin receiving said column address strobe signal.

13. The computer system of claim 11, wherein said at least one memory module has a memory capacity of approximately 256 megabytes.

14. The computer system of claim 10, wherein said memory system comprises:

the connection device comprising a memory board including a plurality of memory slot connectors coupled to said memory controller, each of said plurality of memory slot connectors including an output enable input contact receiving said column address strobe signal; and a plurality of memory modules, each for coupling to a corresponding one of said plurality of memory slot connectors, each including a memory module output enable input contact that couples to said output enable input contact of a corresponding memory slot connector, and each including at least one extended-data output memory chip mounted thereon having an output enable input pin coupled to said memory module output enable input contact.

15. The computer system of claim 14, further comprising:

said memory board including a column address strobe conductor receiving said column address signal and an output enable input conductor electrically coupled to said column address strobe conductor; and each of said plurality of memory modules including a module connector that plugs into any one of said plurality of memory slot connectors, said module connector including an output enable input contact that couples to said output enable input conductor.

16. The computer system of claim 14, further comprising:

said at least one extended-data output memory chip comprising a plurality of extended-data output memory chip each having an output enable input pin coupled to said memory module output enable input contact.

17. The computer system of claim 16, wherein said memory system has a memory capacity of approximately four gigabytes.

18. A method of operating a memory system designed for fast page mode memory to operate with extended-data output memory devices, comprising:

replacing fast page mode memory devices with extended-data output memory devices;

asserting column and row address signals and corresponding strobe signals including a column address strobe signal according to fast page mode operation to the extended-data output memory devices, and providing the column address strobe signal to the output enable input of each of the extended-data output memory devices.

19. The method of claim 18 wherein said providing the column address strobe signal to the output enable input of each of the extended-data output memory devices further comprises:

providing a memory board with at least one memory module connector having an output enable input contact receiving the column address strobe signal.

20. The method of claim 19 wherein said providing the column address strobe signal to the output enable input of each of the extended-data output memory devices further comprises:

providing at least one memory module with at least one extended-data output memory chip having an output enable input that electrically couples to the output enable input contact when the at least one memory module is plugged into the at least one memory module connector.

* * * * *